United States Patent
Yeo et al.

(10) Patent No.: US 10,229,965 B2
(45) Date of Patent: Mar. 12, 2019

(54) METHOD FABRICATING ORGANIC LIGHT EMITTING DIODE DISPLAY DEVICE

(71) Applicant: LG Display Co., Ltd., Seoul (KR)

(72) Inventors: Jong-Hoon Yeo, Incheon (KR); Seung-Han Paek, Bucheon-si (KR); Hyo-Dae Bae, Paju-si (KR); Young-Mu Oh, Seoul (KR); Jeong-Won Lee, Goyang-si (KR); Heon-Il Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/788,665

(22) Filed: Oct. 19, 2017

(65) Prior Publication Data

US 2018/0040685 A1  Feb. 8, 2018

Related U.S. Application Data

(62) Division of application No. 15/183,166, filed on Jun. 15, 2016, now Pat. No. 9,825,115.

(30) Foreign Application Priority Data

Jun. 30, 2015 (KR) .................. 10-2015-0093273

(51) Int. Cl.
*H01L 27/32* (2006.01)
*H01L 51/50* (2006.01)
*H01L 51/52* (2006.01)
*H01L 51/56* (2006.01)
(Continued)

(52) U.S. Cl.
CPC ...... *H01L 27/3279* (2013.01); *H01L 27/3246* (2013.01); *H01L 27/3276* (2013.01);
(Continued)

(58) Field of Classification Search
CPC . H01L 27/32; H01L 27/3279; H01L 27/3246; H01L 27/3276; H01L 51/5072; H01L 51/5088; H01L 51/5092
See application file for complete search history.

(56) References Cited

U.S. PATENT DOCUMENTS 8,410,684 B2 * 4/2013 Vaufrey .............. H01L 27/3246
313/504
2006/0049768 A1 * 3/2006 Yang ..................... H04N 17/04
315/150

(Continued)

FOREIGN PATENT DOCUMENTS

CN   1913171 A   2/2007
CN   101682957 A  3/2010

OTHER PUBLICATIONS

European Patent Office, Extended European Search Report and Opinion, EP Patent Application No. 16177102.7, dated Oct. 28, 2016, eight pages.

(Continued)

*Primary Examiner* — Phuc T Dang
(74) *Attorney, Agent, or Firm* — Fenwick & West LLP

(57) ABSTRACT

An organic light emitting diode display device comprises a substrate including a pixel region, the pixel region including a first portion and a second portion, a first electrode in the second portion of the pixel region, a bank layer separating the first portion and the second portion of the pixel region, an emitting layer in the second portion of the pixel region but not in the first portion of the pixel region, an emission assisting layer extending in the first portion of the pixel region and in the second portion of the pixel region, the emission assisting layer in the first portion of the pixel region being more conductive than the emission assisting layer in the second portion of the pixel region, and a second (Continued)

electrode on the emission assisting layer in the first portion of the pixel region and in the second portion of the pixel region.

7 Claims, 4 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5215* (2013.01); *H01L 51/5228* (2013.01); *H01L 51/5231* (2013.01); *H01L 51/56* (2013.01); *H01L 2227/323* (2013.01); *H01L 2251/5369* (2013.01); *H01L 2251/564* (2013.01)

(56) References Cited

U.S. PATENT DOCUMENTS

| | | | |
|---|---|---|---|
| 2008/0067932 A1 | 3/2008 | Baek et al. | |
| 2009/0128457 A1* | 5/2009 | Nagayama | H01L 51/56 345/76 |
| 2010/0289417 A1 | 11/2010 | Fujita et al. | |
| 2010/0302221 A1 | 12/2010 | Okumoto | |
| 2011/0084262 A1* | 4/2011 | Kondratyuk | H01L 29/78645 257/43 |
| 2014/0131692 A1 | 5/2014 | Mishima et al. | |
| 2014/0299869 A1* | 10/2014 | Kugler | H01L 51/0047 257/40 |
| 2014/0346459 A1* | 11/2014 | Song | H01L 51/5228 257/40 |
| 2015/0014658 A1* | 1/2015 | Choung | H01L 51/5203 257/40 |
| 2015/0303245 A1* | 10/2015 | Kashiwabara | H01L 27/3276 257/40 |
| 2016/0172425 A1 | 6/2016 | Lee | |
| 2017/0110530 A1* | 4/2017 | Lee | H01L 27/3248 |

OTHER PUBLICATIONS

The State Intellectual Property Office of the People's Republic of China, First Notification of Office Action, CN Patent Application No. 201610474927.8, dated Sep. 27, 2018, 12 pages.

* cited by examiner

METHOD FABRICATING ORGANIC LIGHT EMITTING DIODE DISPLAY DEVICE

CROSS-REFERENCE TO RELATED APPLICATIONS

This application is a divisional of U.S. application Ser. No. 15/183,166 filed on Jun. 15, 2016, which claims the benefit under 35 U.S.C. § 119(a) of Korean Patent Application No. 10-2015-0093273, filed on Jun. 30, 2015, in the Korean Intellectual Property Office, both of which are hereby incorporated by reference as if fully set forth herein.

BACKGROUND

1. Technical Field

The present disclosure relates to an organic light emitting diode display device, and more particularly, to an organic light emitting diode display device where an electrode of a light emitting diode and an auxiliary line are connected to each other through an emission assisting layer and a method of fabricating the organic light emitting diode display device.

2. Discussion of the Related Art

Among various flat panel displays (FPDs), an organic light emitting diode (OLED) display device has properties such as high luminance and low driving voltage. The OLED display device uses an emissive electroluminescent layer to realize a high contrast ratio and a thin profile, and is excellent at displaying a moving image because of a short response time of several micro seconds (μsec). Also, the OLED display device has no limitation on a viewing angle and is stable even in a low temperature. Since the OLED display device is typically driven by a low voltage (e.g., between 5V and 15V in direct current (DC)), fabrication and design of a driving circuit is easy. Further, a fabrication process for the OLED display device including a deposition and an encapsulation is simple.

The OLED display device may be classified into a top emission type and a bottom emission type according to a light emission direction. The top emission type OLED display device having an advantage in an aperture ratio has been researched and developed as a product having a large size and a high resolution.

FIG. 1 is a cross-sectional view showing an organic light emitting diode display device according to a related art.

In FIG. 1, the OLED display device 10 according to the related art includes a substrate 20 and a thin film transistor (TFT) Td and a light emitting diode (LED) De in each pixel region P on the substrate 20.

A semiconductor layer 22 is formed on the substrate 20, and a gate insulating layer 24 is formed on the semiconductor layer 22. The semiconductor layer 22 includes an active region of an intrinsic semiconductor material at a central portion and source and drain regions of an impurity-doped semiconductor material at both sides of the central portion.

A gate electrode 26 is formed on the gate insulating layer 24 over the semiconductor layer 22, and an interlayer insulating layer 28 is formed on the gate electrode 26. The interlayer insulating layer 28 and the gate insulating layer 24 include first and second contact holes exposing the source and drain regions, respectively, of the semiconductor layer 22.

Source and drain electrodes 30 and 32 spaced apart from each other are formed on the interlayer insulating layer 28 corresponding to the semiconductor layer 22. The source and drain electrodes 30 and 32 are connected to the source and drain regions of the semiconductor layer 22 through the first and second contact holes, respectively.

The semiconductor layer 22, the gate electrode 26, the source electrode 30 and the drain electrode 32 constitute a thin film transistor (TFT) Td. A passivation layer 34 is formed on the TFT Td and has a third contact hole exposing the source electrode 30.

A first electrode 36 is formed on the passivation layer 34 corresponding to a central portion of the pixel region P and is connected to the source electrode 30 through the third contact hole.

A bank layer 38 is formed on the first electrode 36. The bank layer 38 covers an edge portion of the first electrode 36 and has an opening exposing a central portion of the first electrode 36.

A first emission assisting layer 40 is formed on the first electrode 36 exposed through the opening of the bank layer 38, and an emitting layer 42 is formed on the first emission assisting layer 40 in the opening of the bank layer 38. In one aspect, the first emission assisting layer 40 assists injection or transport of carriers (e.g., holes or electrons).

A second emission assisting layer 44 is formed on the entire surface of the substrate 20 having the emitting layer, and a second electrode 46 is formed on the entire surface of the substrate 20 having the second emission assisting layer 44. In one aspect, the second emission assisting layer 44 assists injection or transport of other carriers (e.g., electrons or holes).

The first emission assisting layer 40 may include a hole injecting layer (HIL) and a hole transporting layer (HTL), and the second emission assisting layer 44 may include an electron injecting layer (EIL) and an electron transporting layer (ETL). The first electrode 36, the first emission assisting layer 40, the emitting layer 42, the second emission assisting layer 44 and the second electrode 46 constitute a light emitting diode De.

In the OLED display device 10, the second emission assisting layer 44 is not patterned in each pixel region P. Instead, the second emission assisting layer 44 is formed on the entire surface of the substrate 20 for cost reduction of and yield increase due to process simplification in a product having a large size and a high resolution.

In addition, since the second electrode 46 should have transparency in the top emission type OLED display device 10, the second electrode 46 may be formed by depositing a metallic material such as aluminum (Al), magnesium (Mg) and silver (Ag) with a relatively thin thickness. However, a resistance of the second electrode 46 increases due to the relatively thin thickness and non-uniformity in brightness is caused by a voltage drop of a low level voltage VSS.

To prevent the non-uniformity in brightness, a structure where the second electrode 46 is connected to an auxiliary electrode or an auxiliary line of a low resistance material at a border of the pixel region P under the emitting layer 42 has been suggested.

In the product having a large size with a high resolution, however, since second emission assisting layer 44 is formed on the entire surface of the substrate 20, it is required to eliminate the second emission assisting layer 44 on the auxiliary electrode or the auxiliary line for connecting the second electrode 46 to the auxiliary electrode or the auxiliary line.

Accordingly, a laser patterning and a patterning using a separator have been suggested as a method of eliminating the second emission assisting layer 44 on the auxiliary electrode or the auxiliary line.

However, for laser patterning, a step of irradiating a laser beam onto the second emission assisting layer 44 on the auxiliary electrode or the auxiliary line is added, therefore a fabrication cost increases and a yield decreases. Similarly, for patterning using the separator, a step of forming the separator is added, thus a fabrication cost increases and a yield decreases. Further, the emitting layer 42 can be deteriorated due to a sputtering for forming a transparent conductive layer as an uppermost layer.

SUMMARY

Embodiments relate to an organic light emitting diode display device and a method of fabricating the same that substantially obviate one or more of the problems due to limitations and disadvantages of the related art.

In one or more embodiments, an organic light emitting diode display device comprises: a substrate including a pixel region, the pixel region including a first portion and a second portion; a first electrode in the second portion of the pixel region; a bank layer separating the first portion and the second portion of the pixel region; an emitting layer in the second portion of the pixel region but not in the first portion of the pixel region; an emission assisting layer extending in the first portion of the pixel region, over the bank, and in the second portion of the pixel region, the emission assisting layer in the first portion of the pixel region being more conductive than the emission assisting layer in the second portion of the pixel region; and a second electrode on the emission assisting layer in the first portion of the pixel region, over the bank, and in the second portion of the pixel region.

In one or more embodiments, the bank layer includes an organic material.

In one or more embodiments, the organic light emitting diode display device further includes an auxiliary line in the first portion of the pixel region below and in contact with the emission assisting layer. The emission assisting layer may have a thickness within a range of 10 Å to 1000 Å, and the emission assisting layer in the second portion of the pixel region between the auxiliary line and the second electrode may have a resistance within a range of 5Ω to 1 kΩ.

In one or more embodiments, the organic light emitting diode display device further includes another auxiliary line of a line shape in the first portion of the pixel region under the auxiliary line, wherein said another auxiliary line is connected to the auxiliary line.

In one or more embodiments, the emission assisting layer in the first portion of the pixel region includes a plurality of conductive particles, the plurality of conductive particles including a same material as one of the auxiliary line and the second electrode.

In one or more embodiments, the auxiliary line and the first electrode are on a same layer.

In one or more embodiments, the organic light emitting diode display device further comprises another emission assisting layer in the second portion of the pixel region between the first electrode and the emitting layer. The emission assisting layer may include a hole injecting layer and a hole transporting layer, and said another emission assisting layer may include an electron injecting layer and an electron transporting layer.

One or more embodiments relate to a method of fabricating an organic light emitting diode display device. The method comprises: forming an auxiliary line in a first portion of a pixel region on a substrate; forming a first electrode in a second portion of the pixel region on the substrate; forming an emitting layer on the first electrode in the second portion of the pixel region; forming an emission assisting layer on the auxiliary line in the first portion of the pixel region and on the emitting layer in the second portion of the pixel region; forming a second electrode on the emission assisting layer in the first portion of the pixel region and the second portion of the pixel region on the emission assisting layer; and applying a bias voltage to the auxiliary line and the second electrode to induce conductive particles in the emission assisting layer in the first portion of the pixel region.

In one or more embodiments, the bias voltage is one of a direct current voltage, an alternating current voltage and a pulse voltage.

In one or more embodiments, the emitting layer and the emission assisting layer are formed through a soluble process.

In one or more embodiments, the method further includes forming another emission assisting layer in the second portion of the pixel region between the first electrode and the emitting layer.

In one or more embodiments, the method further includes forming another auxiliary line of a line shape in the first portion of the pixel region under the auxiliary line. Said another auxiliary line may be connected to the auxiliary line.

In one or more embodiments, the method further includes forming a bank layer between the first portion of the pixel region and the second portion of the pixel region after forming the first electrode in the first portion of the pixel region and the auxiliary line in the second portion of the pixel region. The emission assisting layer may be formed on the auxiliary line in the first portion of the pixel region, on the emitting layer in the second portion of the pixel region and on the bank layer between the first portion of the pixel region and the second portion of the pixel region.

In one or more embodiments, the auxiliary line and the first electrode are formed on a same layer simultaneously.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
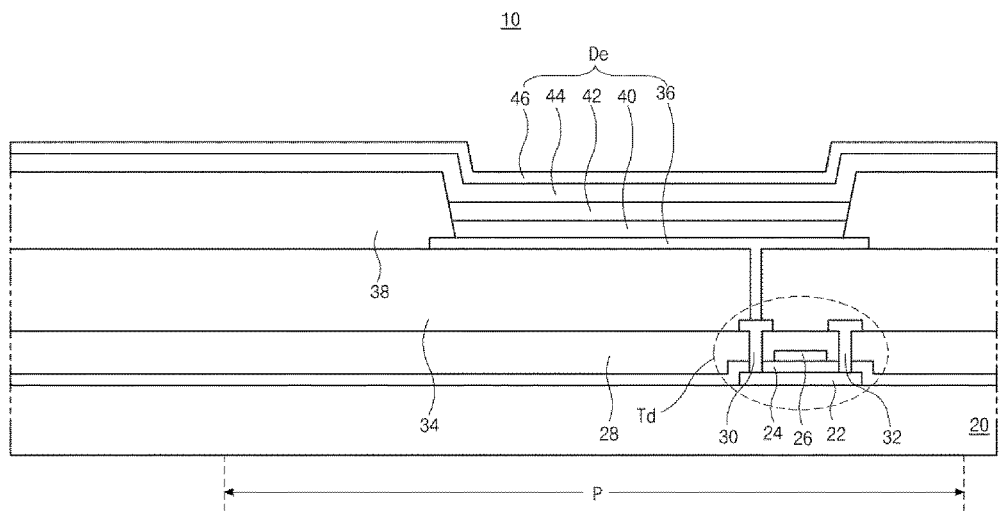
FIG. 1 is a cross-sectional view showing an organic light emitting diode display device according to a related art.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
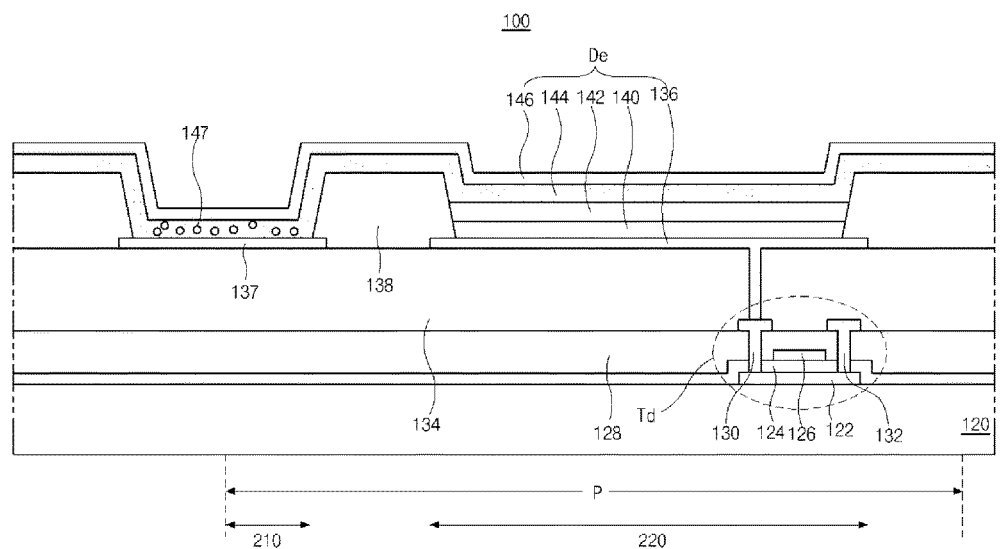
FIG. 2 is a cross-sectional view showing a top emission type organic light emitting diode display device according to an embodiment of the present disclosure.

FIG. 2 is a cross-sectional view showing a top emission type organic light emitting diode display device according to an embodiment of the present disclosure.

In FIG. 2, an organic light emitting diode (OLED) display device 110 includes a substrate 120 and a thin film transistor (TFT) Td and a light emitting diode (LED) De in each pixel region P on the substrate 120.

A semiconductor layer 122 is formed on the substrate 120, which may be referred to as a lower substrate, a TFT substrate or a backplane, and a gate insulating layer 124 is formed on the semiconductor layer 122. The semiconductor layer 122 may include an active region of an intrinsic semiconductor material at a central portion and source and drain regions of an impurity-doped semiconductor material at both sides of the central portion.

A gate electrode 126 is formed on the gate insulating layer 24 over the semiconductor layer 122, and an interlayer insulating layer 128 is formed on the gate electrode 126. The interlayer insulating layer 128 and the gate insulating layer 124 include first and second contact holes exposing the source and drain regions, respectively, of the semiconductor layer 122.

Source and drain electrodes 130 and 132 spaced apart from each other are formed on the interlayer insulating layer 128 corresponding to the semiconductor layer 122. The source and drain electrodes 130 and 132 are connected to the source and drain regions of the semiconductor layer 122 through the first and second contact holes, respectively.

The semiconductor layer 122, the gate electrode 126, the source electrode 130 and the drain electrode 132 constitute a thin film transistor (TFT) Td. Although the TFT Td of a coplanar type is formed on the substrate 120 in FIG. 2, the TFT of a staggered type may be formed on the substrate in another embodiment. Although the driving TFT Td is shown in FIG. 2, a plurality of TFTs including a switching TFT having the same structure as the driving TFT Td may be further formed in each pixel region P.

Although not shown, a gate line, a data line and a power line may be formed on the substrate 120. The gate line may cross the data line and the power line to define the pixel region P. In one aspect, each pixel region P includes a first portion 210 in which an auxiliary electrode is disposed, and a second portion 220 from which light is emitted. In addition, the switching TFT may be connected to the gate line and the data line, and the driving TFT Td may be connected to the switching TFT and the power line.

A passivation layer 134 is formed on the TFT Td and has a third contact hole exposing the source electrode 130.

A first electrode 136 is formed on the passivation layer 134 corresponding to the second portion 220 (e.g., central portion) of the pixel region P, and an auxiliary line 137 is formed on the passivation layer 134 corresponding to a first portion 210 of the pixel region P. The first electrode 136 is connected to the source electrode 130 through the third contact hole. The auxiliary line 137 may include the same material and be formed in the same layer as the first electrode 136.

In one or more embodiments, the drain electrode 132 may be exposed through the third contact hole and connected to the first electrode 136 instead of the source electrode 130.

Although the auxiliary line 137 of a line shape is formed on the passivation layer 134 along the first portion 210 of the pixel region P in FIG. 2, a first auxiliary line (auxiliary electrode or auxiliary pattern) of an island shape and a second auxiliary line of a line shape connected to each other through a contact hole may be formed over the substrate 120 for further reducing the resistance in another embodiment. For example, the first auxiliary line of an island shape having the same material and in the same layer as the first electrode 136 may be formed on the passivation layer 134 at the first portion 210 of the pixel region P. In addition, the second auxiliary line of a line shape including the same material and in the same layer as the gate electrode 126 may be formed between the gate insulating layer 124 and the interlayer insulating layer 128 along the first portion 210 of the pixel region P. Alternatively, the second auxiliary line of a line shape including the same material and the same layer as the source and drain electrodes 130 and 132 may be formed between the interlayer insulating layer 128 and the passivation layer 134 along the first portion 210 of the pixel region P.

A bank layer 138 is formed on the first electrode 136 and the auxiliary line 137. The bank layer 138 covers an edge portion of the first electrode 136 and an edge portion of the auxiliary line 137. In one or more embodiments, the bank layer 138 separates the first portion 210 and the second portion 220 of the pixel region P. In addition, the bank layer 138 has first and second openings exposing a central portion of the first electrode 136 in the second portion 220 of the pixel region P and a central portion of the auxiliary line 137 in the first portion 210 of the pixel region P.

The bank layer 138 may include an organic insulating material or an inorganic insulating material for maintaining a contact property (e.g., hydrophilic property or hydrophobic property) with a first emission assisting layer 140 and an emitting layer 142 (also referred to as "light emitting layer 142") formed in a subsequent process.

A first emission assisting layer 140 is formed on the first electrode 136 exposed through the first opening of the bank layer 138 in the second portion 220 of the pixel region P, and an emitting layer 142 is formed on the first emission assisting layer 140 in the first opening of the bank layer 138 in the second portion 220 of the pixel region P. The first emission assisting layer 140 and the emitting layer 142 may be formed in each pixel region P by patterning an organic material.

The first emission assisting layer 140 may include a hole injecting layer (HIL) and a hole transporting layer (HTL), and the emitting layer 142 may include individual organic material for each pixel region P to emit a light of different color. The first emission assisting layer 140 may be omitted in another embodiment.

In one or more embodiments, a second emission assisting layer 144 extends over the first portion 210 of the pixel region P, the bank layer 138, and the second portion 220 of the pixel region P. Similarly, a second electrode 146 extends over the first portion 210 of the pixel region P, the bank layer 138, and the second portion 220 of the pixel region P on the second emission assisting layer 144. In one embodiment, the second emission assisting layer 144 may be formed on the entire surface of the substrate 120 having the emitting layer 142, and the second electrode 146 may be formed on the second emission assisting layer 144 over the entire surface of the substrate 120.

The second emission assisting layer 144 may include an electron injecting layer (EIL) and an electron transporting layer (ETL) and may have a thickness within a range of about 10 Å to about 1000 Å.

The first emission assisting layer 140, the emitting layer 142 and the second emission assisting layer 144 may be formed through a soluble process such as an inkjet printing and a nozzle printing. The second electrode 146 may be formed through a thermal evaporation.

The first electrode 136, the first emission assisting layer 140, the emitting layer 142, the second emission assisting layer 144 and the second electrode 146 constitute a light emitting diode De, and the first electrode 136 and the second electrode 146 may be an anode and a cathode, respectively. In other embodiments, the first electrode 136 and the second electrode 146 may be a cathode and an anode, respectively.

For example, the first electrode 136 may have a single layered structure of a transparent conductive material such as indium tin oxide (ITO) or a double layered structure of a metallic material and a transparent conductive material. The second electrode 146 may have a single layered structure of one of aluminum (Al), magnesium (Mg) and silver (Ag) or a double layered structure of at least two of aluminum (Al), magnesium (Mg) and silver (Ag).

Although not shown in FIG. 2, a capping layer including one of an organic material, an inorganic material and a metal oxide material may be formed on the entire surface of the substrate 120 having the second electrode 146. The capping layer may have a refractive index greater than about 1.5. The capping layer may cover the light emitting diode De to prevent penetration of moisture into the emitting layer 142 of the light emitting diode De. In addition, the capping layer may minimize reflection of an external light on the second electrode 146 and may increase a transmittance of the second electrode 146.

Further, an encapsulation substrate may be disposed over the second electrode 146. The encapsulation substrate may be attached to the substrate 120 using a seal pattern or a seal layer.

In the OLED display device 110, the second emission assisting layer 144 and the second electrode 146 are sequentially formed on the auxiliary line 137 exposed through the second opening of the bank layer 138. After the second electrode 146 is formed, a bias voltage is applied to the auxiliary line 137 and the second electrode 146 during a fabrication process. As a result, a plurality of conductive particles 147 of the auxiliary line 137 or the second electrode 146 may be induced in the second emission assisting layer 144 due to electromigration.

Accordingly, the second emission assisting layer 144 between the auxiliary line 137 and the second electrode 146 may include the plurality of conductive particles 147 to have a conductive property or to improve conductivity compared to without the conductive particles 147.

In one aspect, the second emission assisting layer 144 with the conductive particles 147 in the first portion 210 of the pixel region P is more conductive than the second emission assisting layer 144 in the second portion 220 of the pixel region P without the conductive particles 147. For example, the second emission assisting layer 144 between the auxiliary line 137 and the second electrode 146 including the plurality of conductive particles 147 may have a resistance between 5Ω and 1 kΩ. The plurality of conductive particles 147 may include the same material as the auxiliary line 137 or the second electrode 146.

Since the second emission assisting layer 144 between the auxiliary line 137 and the second electrode 146 in the first portion 210 of the pixel region P has a conductive property or has improved conductivity due to the conductive particles 147 compared to the second emission assisting layer 144 in the second portion 220 of the pixel region P, the auxiliary line 137 and the second electrode 146 are electrically connected to each other through the second emission assisting layer 144. Accordingly, the resistance of the second electrode 146 having a relatively thin thickness can be lowered due to an electrical connection to the auxiliary line 137 through the second emission assisting layer 144, and a voltage drop of a low level voltage VSS applied to the second electrode 146 while the OLED display device 110 is driven can be reduced. As a result, non-uniformity in brightness and deterioration in display quality can be prevented.

A method of fabricating the OLED display device 110 will be illustrated hereinafter.

FIGS. 3A through 3E are cross-sectional views showing a method of fabricating an organic light emitting diode display device according to an embodiment of the present disclosure. Illustration for the same parts as those of FIG. 2 may be omitted.

Figure 3A:
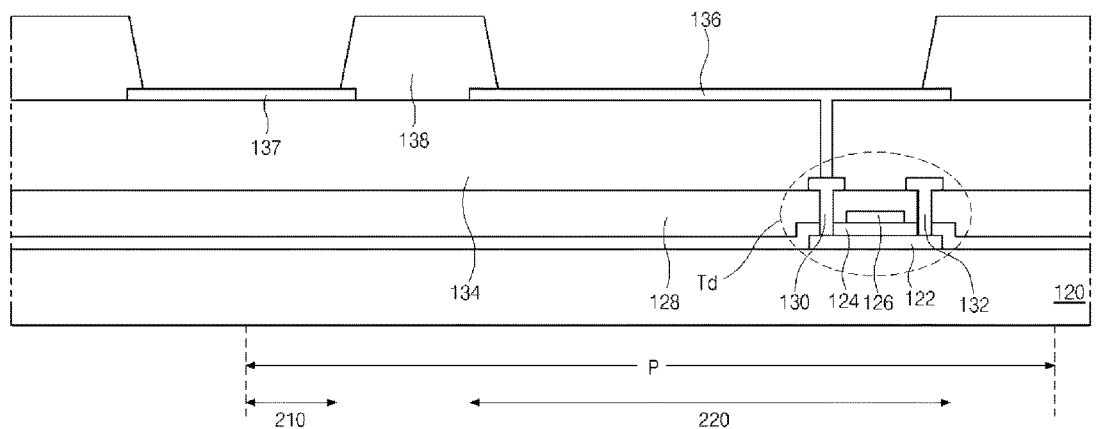
FIGS. 3A through 3E are cross-sectional views showing a method of fabricating an organic light emitting diode display device according to an embodiment of the present disclosure.

In FIG. 3A, a semiconductor layer 122 is formed in each pixel region P on a substrate 120, and a gate insulating layer 124 is formed on the entire surface of the substrate 120 having the semiconductor layer 122.

Next, a gate electrode 126 is formed on the gate insulating layer 124 corresponding to the semiconductor layer 122, and an interlayer insulating layer 128 is formed on the gate electrode 126.

Next, source and drain electrodes 130 and 132 spaced apart from each other are formed on the interlayer insulating layer 128 corresponding to the semiconductor layer 122. The semiconductor layer 122, the gate electrode 126, the source electrode 130 and the drain electrode 132 constitute a thin film transistor (TFT) Td.

Next, a passivation layer 134 is formed on the TFT Td.

Next, a first electrode 136 is formed on the passivation layer 134 corresponding to the second portion 220 of the pixel region P, and an auxiliary line 137 is formed on the passivation layer 134 corresponding to the first portion 210 of the pixel region P.

Next, a bank layer 138 is formed on the first electrode 136 and the auxiliary line 137. The bank layer 138 covers an edge portion of the first electrode 136 and an edge portion of the auxiliary line 137. In addition, the bank layer 138 has a first opening exposing a central portion of the first electrode 136 and a second opening exposing a central portion of the auxiliary line 137.

Figure 3B:
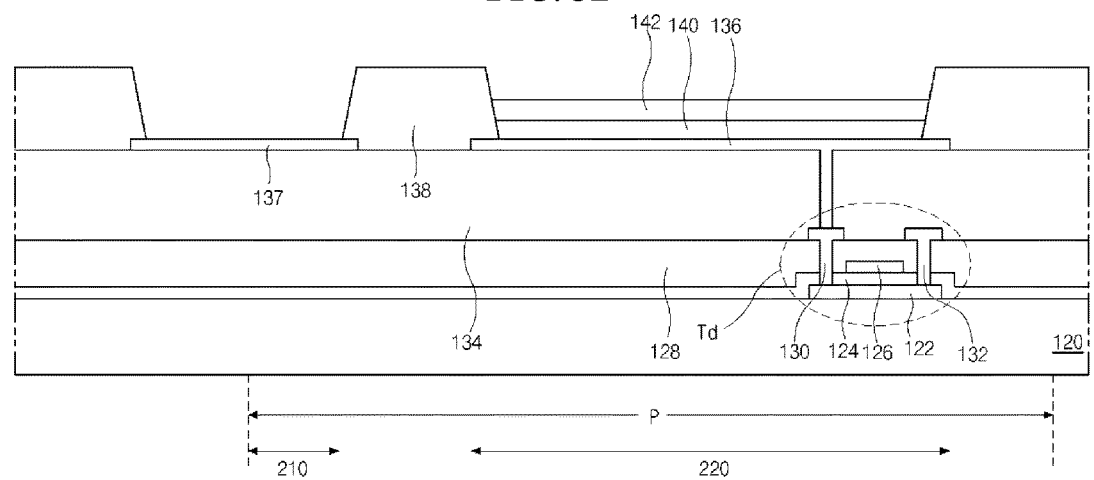

In FIG. 3B, a first emission assisting layer 140 is formed on the first electrode 136 exposed through the first opening of the bank layer 138, and an emitting layer 142 is formed in the first opening of the bank layer 138 on the first emission assisting layer 140. The first emission assisting layer 140 and the emitting layer 142 may be patterned in each pixel region P through a soluble process such as an inkjet printing and a nozzle printing using an organic material. In addition, the first emission assisting layer 140 may include a hole injecting layer (HIL) and a hole transporting layer (HTL), and the emitting layer 142 may include individual organic material for each pixel region P to emit light of different color.

Figure 3C:
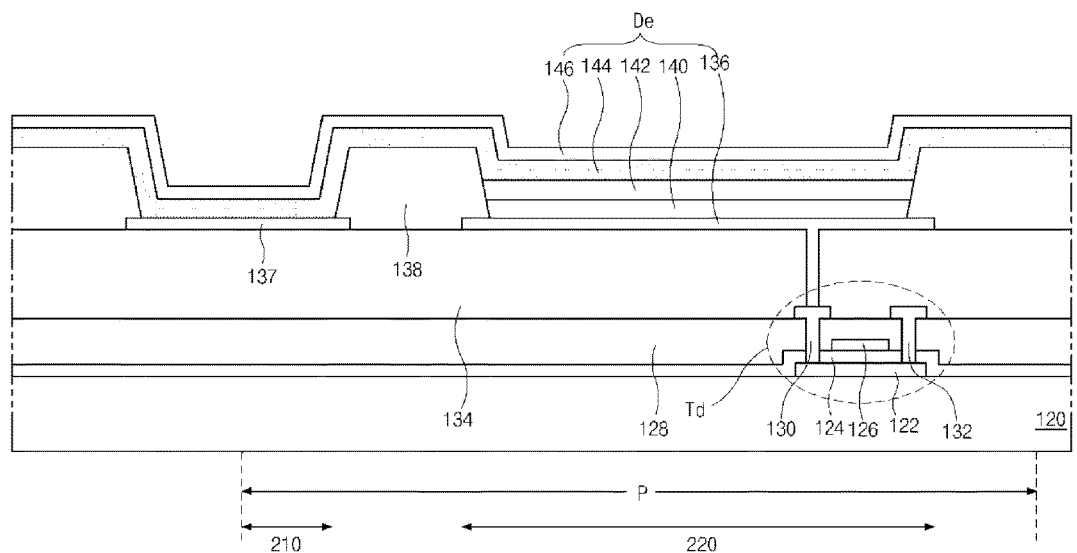

In FIG. 3C, a second emission assisting layer 144 is formed on the entire surface of the substrate 120 having the emitting layer 142 and the auxiliary line 137, and a second electrode 146 is formed on the entire surface of the substrate 120 having the second emission assisting layer 144. The second emission assisting layer 144 may be formed through a soluble process such as an inkjet printing and a nozzle printing using an organic material for reducing a fabrication cost and increasing a yield, and the second electrode 146 may be formed through a thermal evaporation using a metallic material. In addition, the second emission assisting layer 144 may include an electron injecting layer (EIL) and an electron transporting layer (ETL) and may have a thickness within a range of about 10 Å to about 1000 Å.

Figure 3D:
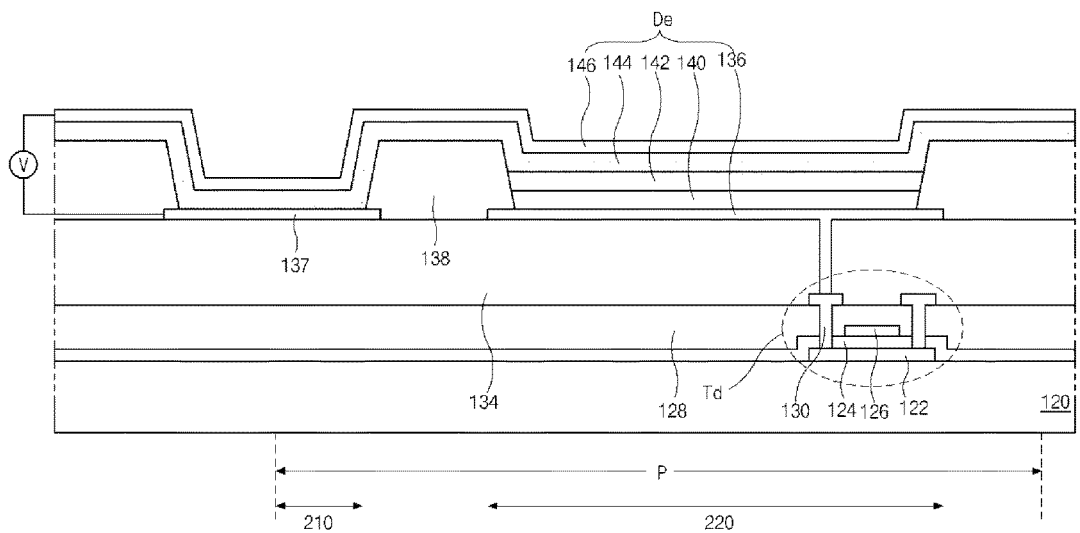

In FIG. 3D, a bias voltage is applied to the auxiliary line 137 and the second electrode 146 during a fabrication process. The bias voltage applied to the auxiliary line 137 and the second electrode 146 may be a direct current (DC) voltage, an alternating current (AC) voltage or a pulse voltage having a shape of a rectangular wave. For example, voltages within a range of about −20V to about +20V in 0.5V steps may be sequentially applied to the auxiliary line 137 and the second electrode 146. In addition, the bias voltage may be repeatedly applied to the auxiliary line 137 and the second electrode 146 several times.

Figure 3E:
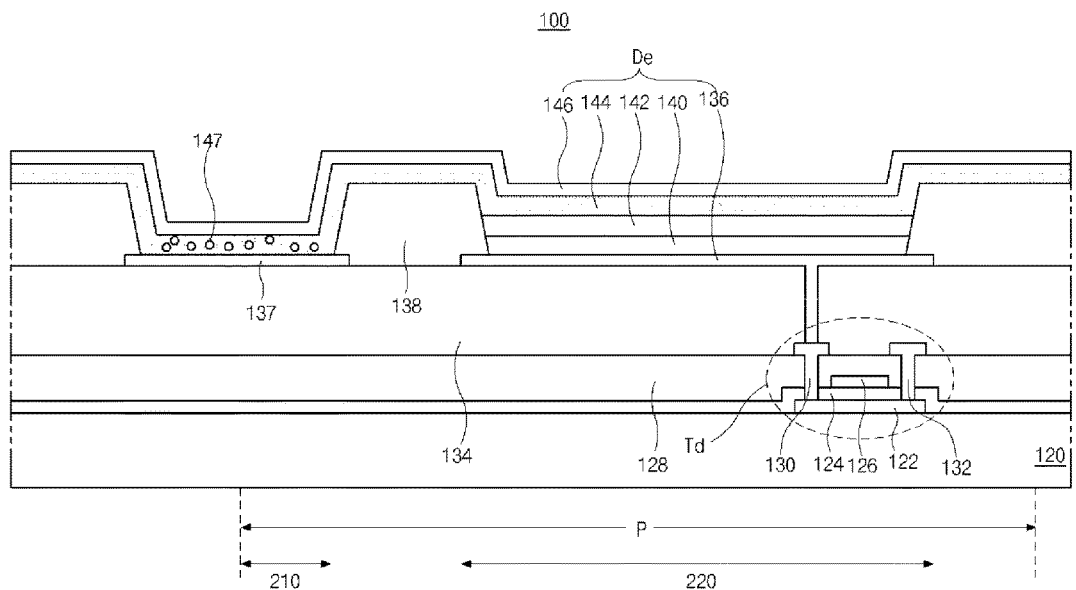

In FIG. 3E, a part of a material constituting the auxiliary line 137 or the second electrode 146 moves into the second emission assisting layer 144 due to an electromigration by the bias voltage applied to the auxiliary line 137 and the second electrode 146 to become a plurality of conductive particles 147. For example, the plurality of conductive particles 147 may include at least one of aluminum (Al), magnesium (Mg) and silver (Ag).

As a result, the second emission assisting layer 144 including the plurality of conductive particles 147 between the auxiliary line 137 and the second electrode 146 attains a conductive property or higher conductivity compared to the second emission assisting layer 144 without the conductive particles 147. Thus, the auxiliary line 137 and the second electrode 146 can be electrically connected to each other through the second emission assisting layer 144 having a conductive property. For example, the second emission assisting layer 144 including the plurality of conductive particles 147 between the auxiliary line 137 and the second electrode 146 may have a resistance between 5Ω and 1 kΩ.

Figure 4:
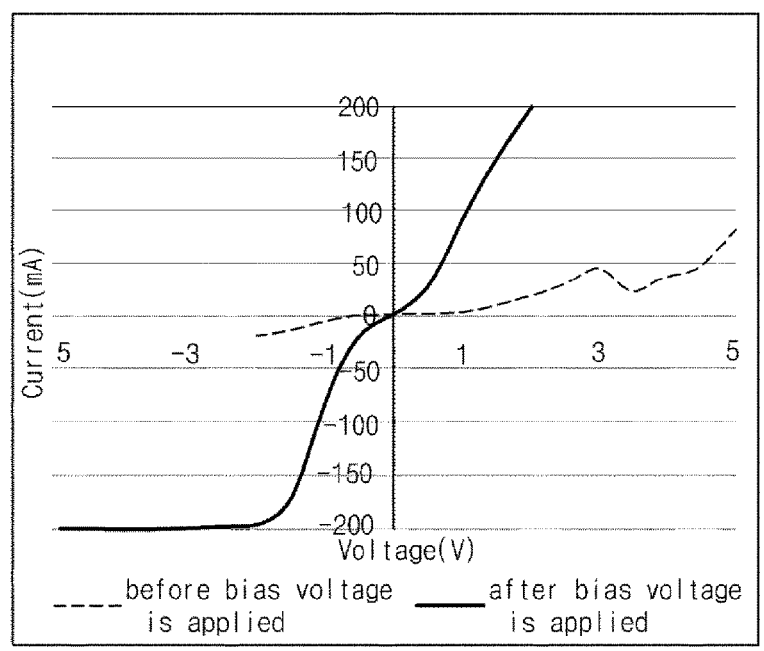
FIG. 4 is a graph showing a conductive property of a second emission assisting layer of an organic light emitting diode display device according to an embodiment of the present disclosure.

FIG. 4 is a graph showing a conductive property of a second emission assisting layer of an organic light emitting diode display device according to an embodiment of the present disclosure.

In FIG. 4, a second emission assisting layer 144 of FIG. 2 of an electron injecting layer (EIL) is formed of sodium fluoride (NaF) having a thickness of about 40 Å, and a second electrode 146 of FIG. 2 is formed of aluminum (Al) having a thickness of about 300 Å. Next, a bias voltage is applied to an auxiliary line 137 of FIG. 2 and the second electrode 146. A resistance of the second emission assisting layer 144 is measured before and after the bias voltage is applied. For example, the resistance of the second emission assisting layer 144 before application of the bias voltage may be within a range of about 6.8 kΩ to about 8.8 kΩ, and the resistance of the second emission assisting layer 144 after application of the bias voltage may be within a range of about 3.9Ω to about 4.6Ω. As a result, the resistance after application of the bias voltage is reduced to about 1/5000 of the resistance before application of the bias voltage.

Although not shown, when the second emission assisting layer 144 is formed of sodium fluoride (NaF) having a thickness of about 100 Å and the second electrode 146 is formed of aluminum (Al) having a thickness of about 300 Å, the resistance of the second emission assisting layer 144 is reduced from a range of about 10 kΩ to about 15 kΩ before application of the bias voltage to a range of about 50Ω to about 73Ω after application of the bias voltage.

In addition, when the second emission assisting layer 144 is formed of sodium fluoride (NaF) having a thickness of about 200 Å and the second electrode 146 is formed of aluminum (Al) having a thickness of about 1000 Å, the resistance of the second emission assisting layer 144 is reduced from a range of about 12 kΩ to about 35 kΩ before application of the bias voltage to a range of about 78Ω to about 80Ω after application of the bias voltage.

Further, when the second emission assisting layer 144 is formed of sodium fluoride (NaF) having a thickness of about 300 Å and the second electrode 146 is formed of aluminum (Al) having a thickness of about 1000 Å, the resistance of the second emission assisting layer 144 is reduced from a range of about 40 kΩ to about 71 kΩ before application of the bias voltage to a range of about 154Ω to about 177Ω after application of the bias voltage.

Since the resistance of the second emission assisting layer 144 is reduced from a value of several tens of kΩ to a value of several hundreds of Ω due to application of the bias voltage, the second emission assisting layer including the plurality of conductive particles 147 of FIG. 2 becomes conductive. As a result, the auxiliary line 137 and the second electrode 146 are electrically connected to each other through the second emission assisting layer 144. However, the second emission assisting layer 144 of the light emitting diode De without the conductive particles 147 in the second portion 220 may have a higher resistance (or may be less conductive) than the second emission assisting layer 144 in the first portion 210 with the conductive particles.

Consequently, in the OLED display device 110 according to an embodiment of the present disclosure, after the second electrode 146 is formed, the bias voltage is applied to the auxiliary line 137 and the second electrode 146, and the plurality of conductive particles 147 of the auxiliary line 137 or the second electrode 146 move into the second emission assisting layer 144 between the auxiliary line 137 and the second electrode 146 due to electromigration.

The second emission assisting layer 144 between the auxiliary line 137 and the second electrode 146 includes the plurality of conductive particles 147 and becomes to have a conductive property. As a result, the auxiliary line 137 and the second electrode 146 are electrically connected to each other through the second emission assisting layer 144.

Accordingly, the resistance of the second electrode 146 having a relatively thin thickness can be reduced due to the auxiliary line 137. In addition, non-uniformity in brightness and deterioration in display quality can be prevented by reducing a voltage drop of a low level voltage VSS applied to the second electrode 146.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating an organic light emitting diode display device comprising:
    forming an auxiliary line in a first portion of a pixel region on a substrate;
    forming a first electrode in a second portion of the pixel region on the substrate;
    forming an emitting layer on the first electrode in the second portion of the pixel region;
    forming an emission assisting layer on the auxiliary line in the first portion of the pixel region and on the emitting layer in the second portion of the pixel region;
    forming a second electrode on the emission assisting layer in the first portion of the pixel region and the second portion of the pixel region on the emission assisting layer; and
    inducing conductive particles in the emission assisting layer in the first portion of the pixel region by applying a bias voltage across the auxiliary line and the second electrode.

2. The method of claim 1, wherein the bias voltage is one of a direct current voltage, an alternating current voltage and a pulse voltage.

3. The method of claim 1, wherein the emitting layer and the emission assisting layer are formed through a soluble process.

4. The method of claim 1, further comprising forming another emission assisting layer in the second portion of the pixel region between the first electrode and the emitting layer.

5. The method of claim 1, further comprising forming another auxiliary line of a line shape in the first portion of the pixel region under the auxiliary line, wherein said another auxiliary line is connected to the auxiliary line.

6. The method of claim 1, further comprising:
    forming a bank layer between the first portion of the pixel region and the second portion of the pixel region after forming the first electrode in the first portion of the pixel region and the auxiliary line in the second portion of the pixel region,
    wherein the emission assisting layer is formed on the auxiliary line in the first portion of the pixel region, on the emitting layer in the second portion of the pixel region and on the bank layer between the first portion of the pixel region and the second portion of the pixel region.

7. The method of claim 1, wherein the auxiliary line and the first electrode are formed on a same layer simultaneously.

* * * * *